US 6,736,984 B2

(12) United States Patent
Golecki

(10) Patent No.: US 6,736,984 B2
(45) Date of Patent: May 18, 2004

(54) NON-MECHANICAL FABRICATION OF CARBON-CONTAINING WORK PIECES

(75) Inventor: Ilan Golecki, Parsippany, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/859,655

(22) Filed: May 17, 2001

(65) Prior Publication Data

US 2002/0172897 A1 Nov. 21, 2002

(51) Int. Cl.[7] ............................................. C03C 25/68
(52) U.S. Cl. ............................. 216/7; 216/51; 216/56; 216/67; 216/77; 216/79; 216/81
(58) Field of Search .......................... 216/81, 79, 77, 216/67, 7, 51, 56

(56) References Cited

U.S. PATENT DOCUMENTS

| | | |
|---|---|---|
| 3,642,513 A | 2/1972 | Sach et al. |
| 4,493,855 A | 1/1985 | Sachdev et al. ............... 427/41 |
| 4,502,916 A | 3/1985 | Umezaki et al. ............ 156/643 |
| 4,767,418 A | 8/1988 | Deininger et al. ............. 623/1 |
| 5,298,298 A | 3/1994 | Hoffman |
| 5,330,616 A * | 7/1994 | Yamazaki ................... 156/643 |
| 5,458,733 A | 10/1995 | Tessmer et al. |
| 5,544,775 A | 8/1996 | Kerth et al. |
| 5,611,942 A | 3/1997 | Mitsui et al. |
| 5,670,788 A * | 9/1997 | Geis ............................ 257/10 |
| 5,679,269 A | 10/1997 | Cohen et al. |
| 6,096,149 A * | 8/2000 | Hetrick et al. .............. 156/155 |
| 6,312,303 B1 * | 11/2001 | Yaniv et al. ................... 313/24 |
| 6,314,228 B1 * | 11/2001 | Korenaga et al. ........... 385/129 |
| 2001/0019467 A1 * | 9/2001 | Otsuka et al. ........... 360/235.2 |
| 2002/0051539 A1 * | 5/2002 | Moynihan et al. ............ 347/68 |

FOREIGN PATENT DOCUMENTS

| | | | |
|---|---|---|---|
| JP | 11-214756 | * | 8/1999 |
| WO | WO 99/33660 | | 7/1999 |

OTHER PUBLICATIONS

"Ion–Bum—Assisted Etching of Diamond", Efremow et al.; J. Vac. Sci. Tech. B3(1), Jan./Feb. 1985; pp. 416–418.*

"ECR Plasma Etching of Chemically Vapor Deposited Thin Films"; Pearton et al.; Electronics Letters; (19921); 28 (9); pp. 822–824.*

"Polyimide Photolithography", IEEE/ISHM 12th International Electronic Manufacturing Technology Symposium— Germany Apr. 1, 1992, pp. 295–314.

"Method for Fabricating Imaged Sticker Sheet for use in Printed Circuit Cards Boards", 2244 Research Disclosure. No. 320, Emsworth, GB, Dec. 1990.

Ishikawa Yamoto, Patent Abstracts of Japan. vol. 1996, No. 12; Publication No.: 08203821; Publication Date: Aug. 9, 1996.

* cited by examiner

Primary Examiner—George A. Goudreau
(74) Attorney, Agent, or Firm—Oral Caglar, Esq.

(57) ABSTRACT

Complex features and fine details are created in a carbon containing work piece by photolithography. A mask layer is deposited by evaporation onto the work piece. A desired pattern is created on the mask layer. The pattern is etched into the work piece and the remaining portion of the mask layer is dissolved.

18 Claims, 2 Drawing Sheets

NON-MECHANICAL FABRICATION OF CARBON-CONTAINING WORK PIECES

BACKGROUND

The present invention relates to a method of forming complex features and fine details in work pieces made of Carbon-Carbon (C—C) composite material and other carbon-containing materials. The present invention also relates to heat exchangers and fuel cells formed of carbon-containing materials.

Carbon-Carbon composite materials are used in certain heat exchangers and fuel cells. Consider a Carbon-Carbon plate-fin heat exchanger core including a stack of plates and fins. The plates may be made from flat thin-gauge two-dimensional Carbon-Carbon woven fabrics, and the fins may be made from thin-gauge two-dimensional Carbon-Carbon woven fabrics that are corrugated. Thickness of the plates and fins may range between about 0.1 millimeters and 1 millimeter.

Fabricating the Carbon-Carbon fins can be both difficult and time consuming. The fins define long, narrow channels that function as fluid passageways. Because many fins have complex shapes, creating a high density of fins (i.e., x number of fins per linear inch) is even more difficult. Yet it is extremely desirable to increase the fin density in order to increase the heat transfer capability of the heat exchanger.

Carbon-Carbon bipolar plates of proton exchange membrane fuel cells are typically flat, having a thickness of about 0.2–1 millimeters and, in addition, having intricately shaped, fine-featured flow fields for channeling the flow of the hydrogen and oxygen gases used in the operation of the fuel cells. These flow fields typically have defined features of submillimeter dimensions. Forming such fine detailed features is extremely difficult.

SUMMARY

Complex shapes and fine details in a carbon-containing work piece are formed using photolithographic etching methodology. A layer may be formed in a specific pattern on one or both sides of the work piece. Selective etching of the exposed portions of the work piece creates the desired features in the work piece.

DETAILED DESCRIPTION

Photolithography is well known for manufacturing integrated circuits and micro-electromechanical systems (MEMS) in semiconductors. The underlying work piece may be formed of Si or GaAs as well as quartz. With proper modification, the same method may be employed with Carbon-Carbon composites and other carbon-containing materials to create fine-dimensional structures with close tolerances without the need for any mechanical machining. Using the present invention, it becomes possible to mass-produce much more robust structures with finer dimensions and less mechanical damage than would otherwise occur with conventional machining techniques.

An advantage of photolithography as compared to conventional machining is that photolithography is directly applicable to large batch processing, assuring very reproducible dimensions in each work piece. As a consequence, the manufacturing time and cost are significantly reduced while the yield of acceptable parts improves.

According to the present invention, a desired pattern may be etched into a layer deposited on the work piece. Additional etching of the exposed portions of the work piece serves to remove Carbon-Carbon composite material, forming the desired features in the underlying work piece.

Figure 1:
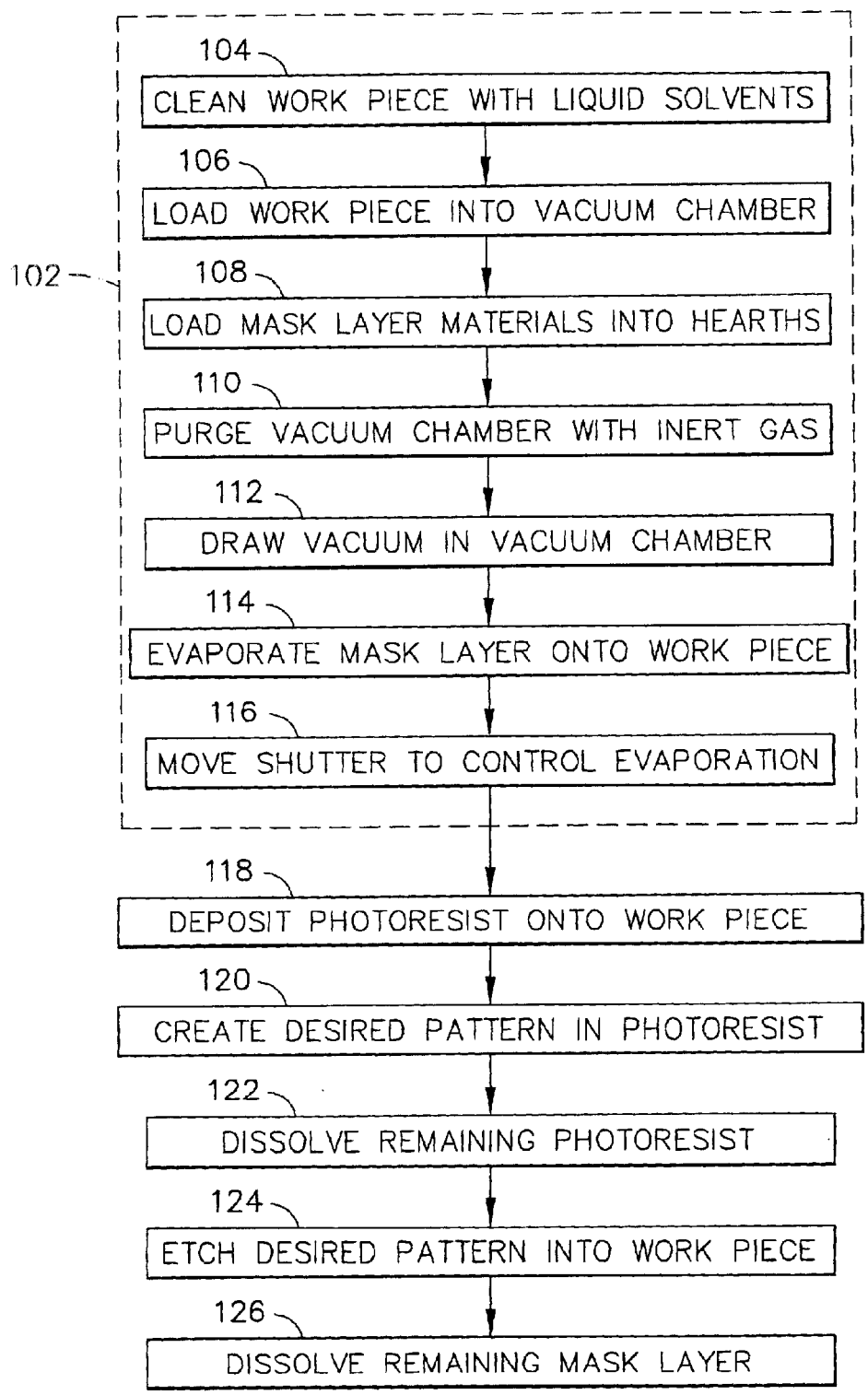
FIG. 1 is an illustration of a method of fabricating a Carbon-Carbon work piece in accordance with the present invention.

Referring to FIG. 1, a photolithographic method of creating fine details and complex features in a work piece made of Carbon-Carbon composite material is illustrated. The method may be employed in fabricating a finely dimensioned, complex-shaped fluid-flow pathway in a flat Carbon-Carbon (C—C) plate of the type required in a bipolar plate of a fuel cell. A layer is deposited on one or both sides of a C—C work piece (block 102). The layer may initially comprise a uniform coating of aluminum, silicon or other appropriate material deposited by physical evaporation, sputtering, chemical vapor deposition, electroplating, electroless plating and the like onto the C—C work piece. Prior to being loaded into a deposition chamber, the work piece is degreased and cleaned using liquid solvents, such as methylene chloride, acetone and isopropanol (block 104). The work piece may also be cleaned via the gas phase. With regard to the use of physical evaporation to form the mask layer, the work piece is then loaded into a deposition vacuum chamber (block 106) where it is placed on a holder (planetary) which can be rotated around one or more axes and which can accommodate multiple work pieces. One or several appropriate mask materials, such as aluminum, silicon, etc. may be employed for creating the mask layer by evaporation onto the work piece. The mask materials are loaded into hearths in the chamber (block 108). The vacuum chamber is pumped down and purged with an inert gas (block 110). This pump/purge cycle is repeated three times in order to remove residual air and water vapor impurities from the chamber. The chamber is then pumped down with a high-vacuum pump to a pressure in the range $1 \times 10^{-7}$ to $1 \times 10^{-5}$ Torr (block 112). The work piece on the rotating planetary is then optionally heated using quartz halogen lamps, in order to further outgas the work piece and/or heat it to a desired temperature. The desired mask layer is then deposited by heating the hearth(s) containing the material(s) to be deposited using an electron gun to the temperature required for evaporating such material(s) at the desired rate(s) (block 114). Alternately, other heating methods may be used to heat the material(s) in order to cause evaporation. When the material(s) in the hearth(s) have reached the set temperature(s), appropriately placed shutters are opened (block 116) to commence the deposition of the mask layer on the work piece. When the desired thickness of the mask layer is reached, the shutters are closed. After the coated work piece has cooled, it is removed from the chamber.

A desired pattern may be formed in the mask layer on the work piece using photolithographic methodology known from semiconductor manufacturing. Briefly, a photoresist layer is deposited on the masked work piece (block 118) and a desired pattern is etched in the photoresist layer using known methods (block 120), such as by only exposing that portion of the photoresist corresponding to the desired pattern to ultraviolet light, achieved by placing a mask in the path of the ultra-violet light, and then dissolving the unexposed portion of the photoresist using appropriate chemicals. The exposed portion of the mask layer is then etched (block 122) using an appropriate chemical. For example HCl is used to etch aluminum or an HF:HNO$_3$ mixture is used to etch silicon, thereby exposing the desired pattern in the work piece.

Alternatively, the desired pattern in the mask layer may be formed by placing a shadow or contact mask over the work piece in the physical evaporation chamber before depositing the mask layer. The desired feature, such as the gas-flow pathway, is created in the work piece by etching the exposed portions of the work piece to a predetermined depth (block 124). Etching the work piece may be accomplished in a number of ways. For example, plasma etching may be employed to remove material from the work piece. Alternatively, reactive ion etching using appropriate gases would provide a similar result. The masked work piece may be subjected to an oxidizing environment at an appropriate temperature, for example in the range of about 400–500° C. A lower oxidation temperature can be used in conjunction with a plasma or electrical discharge, wherein the mask layer would serve as a stable barrier against oxidation on the still coated portions of the work piece.

Once the work piece is etched to a predetermined depth, the remaining mask layer is dissolved or etched (block 126) using either liquid phase etchants, e.g. HCl for aluminum or gas phase etchants. Alternately, the mask layer may be removed by other methods, for example by melting. Aluminum melts at 660° C., at which temperature carbon is stable.

The present invention is not limited to the specific embodiment described above. The mask layer may be formed of a variety of materials other than aluminum or silicon. For example, a layer of silicon dioxide or tungsten may be substituted. The mask layer may also be formed using other methods, such as sputtering, chemical vapor deposition, electroplating, electroless plating, etc.

Figure 2:
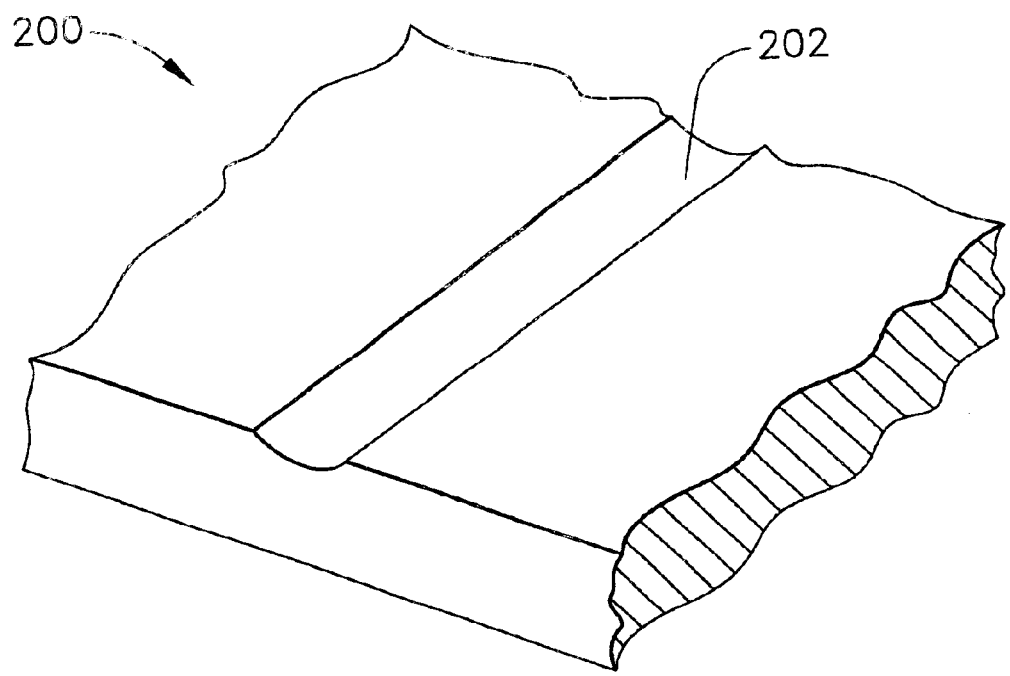
FIG. 2 is an illustration of a work piece formed in accordance with the method of FIG. 1.

The photolithographic method may be used to fabricate the Carbon-Carbon work piece 200 as illustrated in FIG. 2. Once the method 100 is completed, the work piece 200 includes a defined area 202 corresponding in size and shape to the location wherein the Carbon-Carbon material has been removed.

The present invention is not limited to Carbon-Carbon work pieces. Other carbon-based work pieces may be used, provided that the mask layer is chemically compatible with the carbon-based work piece.

Although the present invention has been described above with reference to specific embodiments, it is not so limited. Instead, the present invention is construed according to the claims that follow.

What is claimed is:

1. A method of forming features in a work piece made of Carbon-Carbon material, the method comprising:
    depositing a mask layer on the work piece;
    creating a pattern in the mask layer by photolithography; and
    etching the pattern into the work piece.

2. The method of claim 1, wherein the photolithography includes depositing a photoresist layer on the masked work and exposing the photoresist to ultra-violet light.

3. The method of claim 2, wherein the unexposed portion of the photoresist layer is dissolved, leaving photoresist in the desired pattern on the mask layer.

4. The method of claim 1, wherein the etching step comprises plasma etching the pattern into the work piece.

5. The method of claim 1, wherein the etching step comprises reactive ion etching the desired pattern into the work piece.

6. The method of claim 1, wherein the etching step comprises subjecting the work piece to oxidation.

7. A method of forming features in a work piece made of Carbon-Carbon material, the method comprising:
    depositing a mask layer on the work piece;
    creating a pattern in the mask layer;
    etching the pattern into the work piece; and
    removing that potion of the mask layer remaining after the etching.

8. The method of claim 7, wherein that portion of the mask layer remaining after the etching step is dissolved by melting.

9. A method of forming details in a work piece made of Carbon-Carbon material, the method comprising:
    depositing a mask layer on at least a portion of the work piece;
    creating the desired pattern in the mask layer;
    removing that portion of the mask layer forming the desired pattern; and
    etching the desired pattern to shape the work piece.

10. The method of claim 9, wherein the mask layer is formed of aluminum.

11. The method of claim 9, wherein the mask layer is formed of silicon.

12. The method of claim 9, wherein the mask layer is deposited on the work piece by physical evaporation.

13. The method of claim 12, wherein shutters are selectively open or shut to control evaporation of the mask layer onto the work piece.

14. The method of claim 12, wherein an election gun is utilized to evaporate the mask layer onto the work piece.

15. The method of claim 9, wherein the mask layer is deposited onto the work piece by sputtering.

16. The method of claim 9, wherein the mask layer is deposited onto the work piece by chemical vapor deposition.

17. The method of claim 9, wherein the mask layer is deposited onto the work piece by electroplating.

18. The method of claim 9, wherein the mask layer is deposited onto the work piece by electroless plating.

* * * * *